(12) United States Patent
Mamitsu et al.

(10) Patent No.: US 8,558,375 B2
(45) Date of Patent: Oct. 15, 2013

(54) SEMICONDUCTOR PACKAGE COOLED BY GROUNDED COOLER

(75) Inventors: Kuniaki Mamitsu, Nukata-gun (JP);
Takahisa Kaneko, Okazaki (JP);
Masaya Tonomoto, Obu (JP);
Masayoshi Nishihata, Chiryu (JP);
Hiroyuki Wado, Toyota (JP); Chikage Noritake, Ama-gun (JP); Eiji Nomura, Kariya (JP); Toshiki Itoh, Nagoya (JP)

(73) Assignee: DENSO CORPORATION, Kariya (JP)

( * ) Notice: Subject to any disclaimer, the term of this patent is extended or adjusted under 35 U.S.C. 154(b) by 21 days.

(21) Appl. No.: 13/170,475

(22) Filed: Jun. 28, 2011

(65) Prior Publication Data

US 2012/0001318 A1      Jan. 5, 2012

(30) Foreign Application Priority Data

Jun. 30, 2010  (JP) .................................. 2010-149673
Apr. 5, 2011   (JP) ................................... 2011-83473

(51) Int. Cl.
*H01L 23/34* (2006.01)

(52) U.S. Cl.
USPC ............................ 257/714; 257/715; 257/716

(58) Field of Classification Search
USPC ................... 257/714–716, E23.098
See application file for complete search history.

(56) References Cited

U.S. PATENT DOCUMENTS

| 8,125,781 B2 | 2/2012 | Mamitsu et al. |
| 2004/0089928 A1 | 5/2004 | Nakajima et al. |
| 2006/0096299 A1 | 5/2006 | Mamitsu et al. |
| 2007/0085197 A1* | 4/2007 | Arai et al. ..................... 257/712 |
| 2008/0273303 A1* | 11/2008 | Pal ................................. 361/689 |
| 2012/0119347 A1 | 5/2012 | Mamitsu et al. |

FOREIGN PATENT DOCUMENTS

| JP | A-06-338577 | 12/1994 |
| JP | 2000-200865 | * 7/2000 |
| JP | A-2000-200865 | 7/2000 |
| JP | 2003-168772 | * 6/2003 |
| JP | A-2003-168772 | 6/2003 |
| JP | A-2007-273884 | 10/2007 |
| JP | 2008-166333 | * 7/2008 |
| JP | A-2008-166333 | 7/2008 |

OTHER PUBLICATIONS

Office Action dated Sep. 21, 2012 and mailed on Sep. 25, 2012 in corresponding JP Patent Application No. 2011-83473 (and English translation).
Office Action dated May 17, 2013 in corresponding CN patent application No. 201110185855.2 (and English translation).

* cited by examiner

*Primary Examiner* — Kevin Parendo
(74) *Attorney, Agent, or Firm* — Posz Law Group, PLC

(57) ABSTRACT

A semiconductor device includes a package and a cooler. The semiconductor package includes a semiconductor element, a metal member, and a molding member for encapsulating the semiconductor element and the metal member. The metal member has a metal portion thermally connected to the semiconductor element, an insulating layer on the metal portion, and a conducting layer on the insulating layer. The conducting layer is at least partially exposed outside the molding member and serves as a radiation surface for radiating heat of the semiconductor element. The cooler has a coolant passage through which a coolant circulates to cool the conducting layer. The conducting layer and the cooler are electrically connected together.

4 Claims, 12 Drawing Sheets

SEMICONDUCTOR PACKAGE COOLED BY GROUNDED COOLER

CROSS REFERENCE TO RELATED APPLICATION

This application is based on and claims priority to Japanese Patent Application No. 2010-149673 filed on Jun. 30, 2010 and No. 2011-83473 filed on Apr. 5, 2011, the contents of which are incorporated herein by reference.

FIELD OF THE INVENTION

The present invention relates to a semiconductor device including a semiconductor package encapsulating a semiconductor element and a metal member for heat radiation of the semiconductor element, and a cooler for cooling a radiation surface of the metal plate.

BACKGROUND OF THE INVENTION

A semiconductor device including a semiconductor package and a cooler for cooling the semiconductor package has been proposed. The semiconductor package includes a semiconductor element and a metal member. The semiconductor element and the metal member are covered with a molding member to form the semiconductor package. A mounting surface of the metal member is connected to the semiconductor element so that heat of the semiconductor element can be transmitted to the metal member. A radiation surface of the metal member is exposed outside the molding member.

The cooler is attached to the semiconductor package in such a manner that the radiation surface of the metal member is in contact with the cooler through an electrically insulating grease. Thus, the heat of the semiconductor package is released to the cooler.

The cooler is typically made of metal. Therefore, as disclosed in, for example, JP-A-2008-166333 or US 2004/0089928 corresponding to JP-3740116, the radiation surface of the metal member is covered with an electrically insulating layer to prevent a short-circuit between the metal member and the cooler. Further, the insulating later is covered with an electrically conducting layer for protecting the insulating layer. The conducting layer of the metal member is in contact with the cooler through the grease.

That is, the metal member has a multilayer structure including a metal portion, an electrically insulating layer on the metal portion, and an electrically conducting layer on the insulating layer. The conducting layer serves as the radiation surface of the metal member.

The present inventors have found out that such a semiconductor device has the following disadvantages. The disadvantages are discussed below with reference to FIGS. 15 and 16.

FIG. 15 is a cross-sectional view of a first conventional semiconductor device, and a FIG. 16 is a cross-sectional view of a second conventional semiconductor device.

Firstly, the second conventional semiconductor device shown in FIG. 16 is discussed. In the second conventional semiconductor device, a heat radiation plate 31 is mounted on a cooler 200 through a grease 300 having a heat conductivity. An electrically insulating substrate 33 is mounded on the radiation plate 31 through a solder 32. A semiconductor element 10 is mounted on the insulating substrate 33 through the solder 32.

The radiation plate 31 is fixed to the cooler 200 by a bolt 34 that reaches the radiation plate 31 by penetrating the radiation plate 31 and the grease 300.

Thus, the radiation plate 31 is pressed by the bolt 34 against the cooler 200 by a pressure necessary to allow the heat to be transmitted from the radiation plate 31 to the cooler 200.

In this case, since the insulating substrate 33 is located directly under the semiconductor element 10, heat of the semiconductor element 10 is transmitted to the insulating substrate J3 at a high heat flux. As a result, an increase in temperature of the insulating substrate J3 is large.

Secondly, the first conventional semiconductor device shown in FIG. 15 is discussed.

The first conventional semiconductor device includes a semiconductor package 100 having a semiconductor element 10 and a metal member 20. The semiconductor element 10 and the metal member 10 are covered with a molding member 60 to form the semiconductor package 100. A mounting surface of the metal member 20 is connected to the semiconductor element 10. A radiation surface of the metal member 20 is exposed outside the molding member 60. The metal member includes a metal portion 21, an electrically insulating layer 22 on the metal portion 21, and an electrically conducting layer 23 on the insulating layer 22. The conducting layer 23 serves as the radiation surface of the metal member 20.

The first conventional semiconductor device further includes a cooler 200 having a coolant passage 201 through which a coolant 202 circulates. The conducting layer 23 of the semiconductor package 100 is in contact with the cooler 200 through an electrically insulating grease 300. Thus, the heat of the semiconductor package 100 is absorbed by the coolant 202 of the cooler 200 so that the conducting layer 23 can be cooled by the coolant 202.

That is, in the first conventional semiconductor device, the semiconductor element 10 is located through the metal portion 21 on the insulating layer 22. Thus, heat of the semiconductor element 10 is radiated to the metal portion 21 and thus transmitted to the insulating layer 22 at a low heat flux. Therefore, the first conventional semiconductor device can have a high heat radiation performance compared to the second conventional semiconductor device. Accordingly, the first conventional semiconductor device can be reduced in size.

By the way, in the first conventional semiconductor device, when a voltage V0 caused by a switching operation of the semiconductor element 10 is applied to a mounding surface (i.e., metal portion 21) of the metal member 20, a voltage V2 is applied to the radiation surface (i.e., conducting layer 23) of the metal member 20.

Specifically, the voltage V2 is given by the following equation:

$$V2 = \{C1/(C1+C2)\} \cdot V0$$

In the above equation, C1 represents a capacitance of a parasitic capacitor formed between the metal portion 21 and the conducting layer 23 through the insulating layer 22. C2 represents a capacitance of a parasitic capacitor formed between the cooler 200 and the conducting layer 23 through the grease 300. When the voltage V2 is applied to the conducting layer 23, noise radiation or partial discharge from the conducting layer 23 may occur. Such noise radiation may damage the grease 300, for example.

The application of voltage V2 to the conducting layer 23 can be prevented by electrically connecting the conducting layer 23 to the cooler 200 through the grease 300. However, since the grease 300 has an electrically insulating property, it is difficult to ensure electrical connection between the conducting layer 23 and the cooler 200. Further, it is difficult to check the electrical connection between the conducting layer 23 and the cooler 200.

SUMMARY OF THE INVENTION

In view of the above, it is an object of the present invention to provide a semiconductor device including a semiconductor package and a cooler having the same potential as a radiation surface of the semiconductor package.

According to an aspect of the present invention, a semiconductor device includes a package and a cooler. The semiconductor package includes a semiconductor element, a metal member, and a molding member for encapsulating the semiconductor element and the metal member. The metal member has a metal portion thermally connected to the semiconductor element, an electrically insulating layer on the metal portion, and an electrically conducting layer on the insulating layer. The conducting layer is at least partially exposed outside the molding member and serves as a radiation surface for radiating heat of the semiconductor element. The cooler has a coolant passage through which a coolant circulates to cool the conducting layer. The conducting layer and the cooler are electrically connected together.

BRIEF DESCRIPTION OF THE DRAWINGS

The above and other objects, features, and advantages will become more apparent from the following description and drawings in which like reference numerals depict like elements. In the drawings.

DETAILED DESCRIPTION OF THE PREFERRED EMBODIMENTS

First Embodiment

Figure 1A:
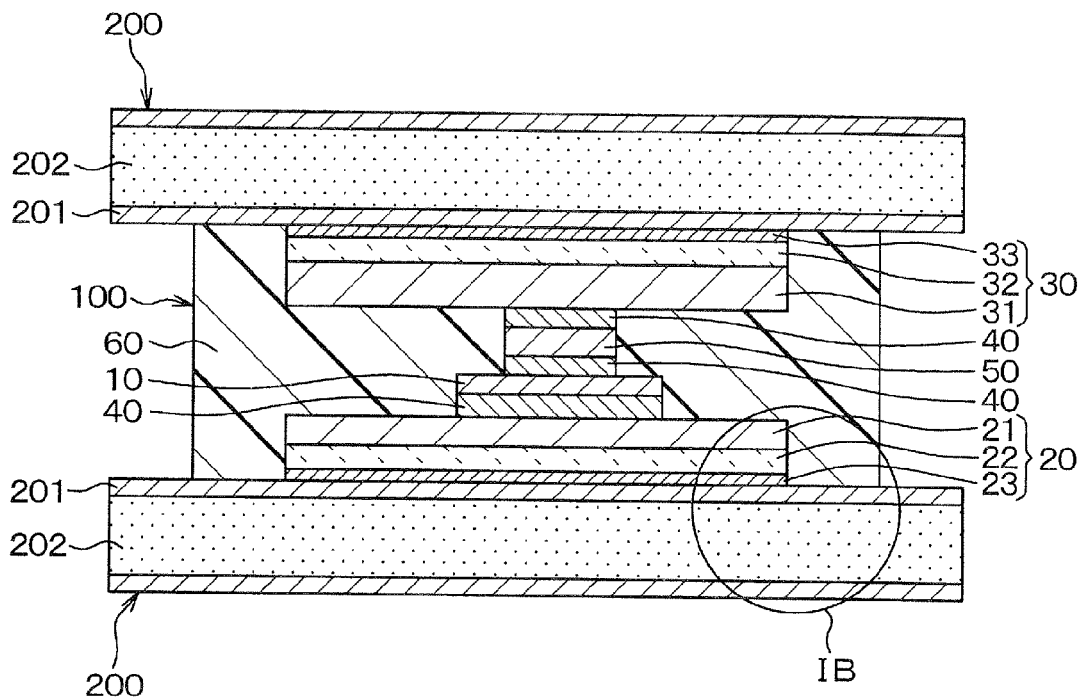
FIG. 1A is diagram illustrating a cross-sectional view of a semiconductor device according to a first embodiment of the present invention.
Figure 1B:
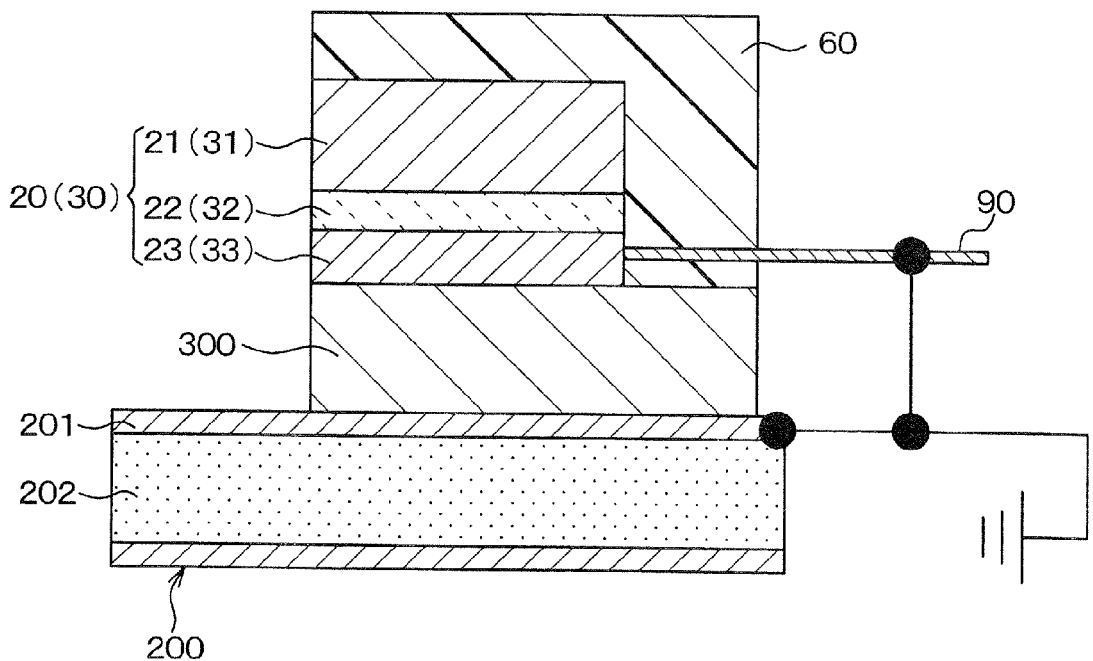
FIG. 1B is an enlarged view of a circle IB in FIG. 1A.
Figure 2:
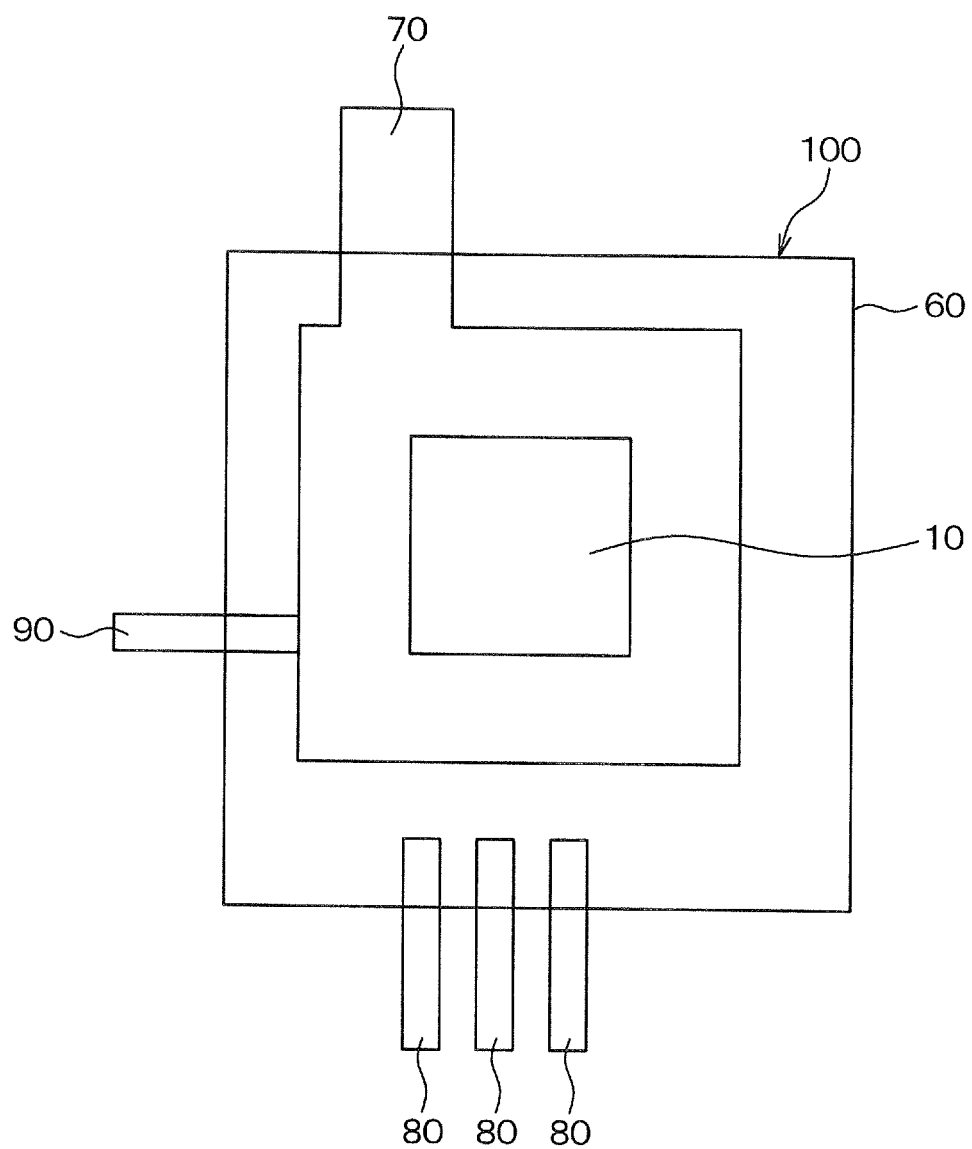
FIG. 2 is a diagram illustrating a simplified top view of a semiconductor package of the semiconductor device of FIG. 1A.

A semiconductor device according to a first embodiment of the present invention is described below with reference to FIGS. 1A, 1B, and 2. FIG. 1A is a cross-sectional view of the semiconductor device. FIG. 1B is an enlarged view of a circle IB in FIG. 1A. FIG. 2 is a simplified top view of a semiconductor package 100 of the semiconductor device. In FIG. 2, a second metal member 30 is omitted to show the inside of a molding member 60.

The semiconductor device includes a semiconductor package 100 and a cooler 200. The cooler 200 is attached to the semiconductor package 100 through a grease 300 having an electrically insulating property.

The semiconductor package 100 includes a semiconductor element 10, a first metal member 20, a second metal member 30, a solder 40 as a conductive adhesive, a heat sink 50, and a molding member 60 as a sealant. In an example shown in FIG. 1A, only one semiconductor element 10 is included in the semiconductor package 100. Alternatively, two or more semiconductor elements 10 can be included in the semiconductor package 100.

The solder 40 is located between the semiconductor element 10 and the first metal member 20 so that the semiconductor element 10 and the first metal member 20 can be joined together. The heat sink 50 is located between the semiconductor element 10 and the second metal member 30. The solder 40 is located between the semiconductor element 10 and the heat sink 50 so that the semiconductor element 10 and the heat sink 50 can be joined together. The solder 40 is located between the second metal member 30 and the heat sink 50 so that the second metal member 30 and the heat sink 50 can be joined together. The heat sink 50 can be made of metal such as copper or aluminum.

The heat sink 50 provides space between the semiconductor element 10 and the second metal member 30. Thus, a bonding wire (not shown) can be connected to the semiconductor element 10. In the example shown in FIG. 1A, the heat sink 50 and the second metal member 30 are separate pieces and then joined together by the solder 40. Alternatively, the heat sink 50 and the second metal member 30 can be a single piece. In this case, the second metal member 30 can have a projection, instead of the heat sink 50, extending toward the semiconductor element 10.

The solder 40 can be a commonly-used solder. For example, the solder 40 can be a lead-free solder such as a Sn—Pb solder or a Sn—Ag solder.

Heat of the semiconductor element 10 is radiated from front and back surfaces of the semiconductor element 10 through the first metal member 20 and the second metal member 30. That is, each of the first metal member 20 and the second metal member 30 is thermally connected at one surface to the semiconductor element 10 and receives the heat from the semiconductor element 10.

Specifically, the first metal member 20 has a mounting surface and a radiation surface opposite to the mounting surface. The semiconductor element 10 is joined through the solder 40 to the mounting surface of the first metal member 20. The second metal member 30 has a mounting surface and a radiation surface opposite to the mounting surface. The heat sink 50 is joined through the solder 40 to the mounting surface of the second metal member 30.

As shown in FIG. 1A, the radiation surfaces of the first and second metal members 20, 30 are exposed outside the molding member 60. The molding member 60 can be made of a commonly-used molding material such as epoxy resin. The molding member 60 can be formed by a transfer molding process, a potting process, or the like.

Specifically, as shown in FIGS. 1A, 1B and 2, space between the mounting surfaces of the first metal member 20 and the second metal member 30 is filled with the molding member 60 so that a side surface of the semiconductor element 10 can be covered with the molding member 60. As mentioned above, the radiation surfaces of the first metal member 20 and the second metal member 30 are exposed outside the molding member 60. Thus, the semiconductor package 100 is formed by encapsulating the semiconductor element 10 and the first and second metal members 20, 30 in the molding member 60 in such a manner that the radiation surfaces of the first and second metal members 20, 30 are exposed outside the molding member 60.

According to the first embodiment, the first metal member 20 includes an electrically conducting layer 23, an electrically insulating layer 22 on the conducting layer 23, and a metal portion 21 on the insulating layer 22. The conducting layer 23 defines the radiation surface of the first metal member 20, and the metal portion 21 defines the mounting surface of the first metal member 20. Likewise, the second metal member 30 includes an electrically conducting layer 33, an electrically insulating layer 32 on the conducting layer 33, and a metal portion 31 on the insulating layer 32. The conducting layer 33 defines the radiation surface of the second metal member 30, and the metal portion 31 defines the mounting surface of the second metal member 30. Each of the first and second metal members 20, 30 has a rectangular plate shape. The planer size of each of the first and second metal members 20, 30 is larger than that of the semiconductor element 10.

The metal portions 21, 31 can be made of metal having good thermal and electric conductivities. For example, the metal portions 21, 31 can be made of aluminum, copper, or an alloy of aluminum and copper. The insulating layers 22, 32 can be made of alumina or the like. For example, the insulating layers 22, 32 can be a thermally-sprayed layer or an adhesive layer. For example, the conducting layers 23, 33 can be a copper foil.

The cooler 200 has a coolant passage 201 made of stainless, copper, aluminum, or the like. A coolant 202 circulates through the coolant passage 201. Although not shown in the drawings, the cooler 200 has additional components, such as a pump and a pipe, for allowing the coolant 202 to circulate through the coolant passage 201. The components are joined to the coolant passage 201 to form the cooler 200. The coolant 202 is a fluid such as water or oil.

The radiation surfaces, i.e., the conducting layers 23, 33 of the metal members 20, 30 of the semiconductor package 100 are cooled by the coolant 202. Specifically, as shown in FIG. 1B, the conducting layers 23, 33 of the metal members 20, 30 of the semiconductor package 100 are in contact with an outer surface of the cooler 200 through the grease 300.

The grease 300 has both a heat conductivity and a viscosity. The grease 300 can be a commonly-used grease such as silicon resin.

The semiconductor package 100 and the cooler 200 are fixed together by clamping or any other appropriate means to allow the conducting layers 23, 33 to remain in contact with the outer surface of the coolant passage 201. Thus, the conducting layers 23, 33 are cooled by the coolant 202 of the cooler 200. That is, heat generated in the semiconductor package 100 is absorbed the coolant 202.

The semiconductor element 10 is not limited to a particular type of element. For example, the semiconductor element 10 can be a power device such as an insulated gate bipolar transistor (IGBT) or a thyristor. The semiconductor element 10 is not limited to a particular shape. For example, as shown in FIGS. 1A, 1B, and 2, the semiconductor element 10 can have a rectangular plate shape.

A surface of the semiconductor element 10 on the second metal member 30-side is defined as a front surface of the semiconductor element 10. In contrast, a surface of the semiconductor element 10 on the first metal member 20-side is defined as a back surface of the semiconductor element 10. Components of the semiconductor element 10 are formed on the front surface-side and not formed on the back surface-side of the semiconductor element 10. Although not shown in the drawings, electrodes are formed on the front and back surfaces of the semiconductor element 10 and electrically connected to the solder 40.

Thus, according to the first embodiment, the electrode on the back surface of the semiconductor element 10 is electrically connected though the solder 40 to the first metal member 20, and the electrode on the front surface of the semiconductor element 10 is electrically connected though the solder 40 to the second metal member 30.

As shown in FIG. 2, the first metal member 20 has a main current terminal 70. The main current terminal 70 extends from the inside to the outside of the molding member 60. According to the first embodiment, the molding member 60 has a rectangular plate shape with four side surfaces, and the main current terminal 70 is exposed to one side surface of the molding member 60.

Although not shown in the drawings, the second metal member 30 has a main current terminal. The main current terminal of the second metal member 30 extends from the inside to the outside of the molding member 60 in the same manner as the main current terminal 70 of the first metal member 20. Specifically, the main current terminal 70 of the first metal member 20 and the main current terminal of the second metal member 30 are exposed to the same side surface of the molding member 60.

The main current terminal 70 allows the semiconductor element 10 to be electrically connected to external wiring such as busbars. Thus, the semiconductor device can be electrically connected to external circuitry through the main current terminal 70.

In this way, the metal members 20, 30 can serve as not only electrodes, but also radiator plates. Specifically, the metal members 20, can radiate heat from the semiconductor element 10 and electrically connect the semiconductor element 10 to external wiring.

The semiconductor element 10 is electrically and thermally connected to the metal members 20, 30 through the solder 40. The solder 40 can be replaced with an electrically conductive adhesive or the like that allows the semiconductor element 10 to be electrically and thermally connected to the metal members 20, 30.

Further, according to the first embodiment, as shown in FIG. 2, the semiconductor device has a control terminal 80. For example, the control terminal 80 can be a lead frame arranged around the semiconductor element 10. A first end of the control terminal 80 is covered with and fixed to the molding member 60, and a second end of the control terminal 80 is exposed outside the molding member 60.

As can be seen from FIG. 2, the main current terminal 70 and the control terminal 80 are exposed to opposing side surfaces of the molding member 60. The exposed second end of the control terminal 80 is electrically connectable to an external control circuit so that the semiconductor device can be electrically connected to the control circuit.

The control terminal 80 is connected to a signal electrode, such as a gate electrode or an emitter electrode, on the surface of the semiconductor element 10. For example, the control terminal 80 can be a gate terminal or an emitter terminal. Although not shown in FIG. 2, the control terminal 80 and the semiconductor element 10 are electrically connected together inside the molding member 60 by a bonding wire or the like.

According to the first embodiment, the cooler 200 and the conducting layer 23 of the first metal member 20 are electrically connected together and thus at the same potential. This relationship is hereafter called that "the first metal member 20 has the same potential structure". Likewise, the cooler 200 and the conducting layer 33 of the second metal member 30 are electrically connected together and thus at the same potential. This relationship is hereafter called that "the second metal member 30 has the same potential structure".

The same potential structure of the first metal member 20 is discussed below with reference mainly to FIG. 1B. Although not shown in the drawings, the same potential structure of the second metal member 30 is formed in the same manner as the same potential structure of the first metal member 20.

That is, as indicated by numbers in parentheses in FIG. 1B, a portion of the second metal member 30 corresponding to a portion of the first metal member 20 in a circle IB in FIG. 1A is configured in a manner as shown in FIG. 1B.

As shown in FIG. 1B, the same potential structure is formed by a terminal member 90. The terminal member 90 has an electrical conductivity. For example, the terminal member 90 can be made of copper or aluminum. A first end of the terminal member 90 is located inside the molding member 60 and electrically connected to the conducting layer 23 of the first metal member 20. A second end of the terminal member 90 is exposed outside the molding member 60 and electrically connected to the cooler 200.

For example, the first end of the terminal member 90 can be electrically connected to the conducting layer 23 by welding, soldering, or brazing. In an example shown in FIG. 1B, the terminal member 90 and the conducting layer 23 are separate pieces and connected together. Alternatively, the terminal member 90 and the conducting layer 23 can be a single piece. In this case, the conducting layer 23 can have a projection, instead of the terminal member 90, extending from the inside to the outside of the molding member 60.

The second end of the terminal member 90 is electrically connected to the outer surface of the coolant passage 201 of the cooler 200 by soldering, welding, screwing, or the like. Alternatively, the second end of the terminal member 90 can be electrically connected through a wire to the components, such as a pump and a pipe, of the cooler 200.

Thus, the conducting layer 23 and the cooler 200 are electrically connected through the terminal member 90. Accordingly, the conducting layer 23 and the cooler 200 are at the same potential. For example, when the cooler 200 is grounded, the conducting layer 23 is grounded.

In the example shown in FIG. 1B, the terminal member 90 extends from a side surface of the conducting layer 23. The terminal member 90 can extend from any other surfaces of the conducting layer 23 except the radiation surface.

Further, as shown in FIG. 2, the terminal member 90 is exposed to a side surface of the molding member 60 different from the side surfaces where the main current terminal 70 and the control terminal 80 are exposed.

Specifically, as mentioned previously, the main current terminal 70 and the control terminal 80 are exposed to opposing side surfaces of the rectangular molding member 60, and the terminal member 90 is exposed to a side surfaces connecting the opposing side surfaces. In such an approach, it is easy to ensure a necessary creepage distance between the terminal member 90 and each of the main current terminal 70 and the control terminal 80. Thus, the semiconductor package 100 can be reduced in size.

A method of manufacturing the semiconductor device according to the first embodiment is described below. Firstly, the semiconductor element 10 is soldered to the mounting surface of the first metal member 20. Then, as needed, the semiconductor element 10 and the control terminal 80 are wire-bonded together. Then, the heat sink 50 is soldered on the semiconductor element 10, and the second metal member 30 is soldered on the heat sink 50.

Then, the molding member 60 is formed by a transfer molding process or a potting process so that a clearance between the first and second metal members 20, 30 and side surfaces of the first and second metal members 20, 30 can be covered with the molding member 60. Thus, the semiconductor element 10 and the first and second metal members 20, 30 are encapsulated in the molding member 60 so that the semiconductor package 100 can be completed. Then, the semiconductor package 100 is joined to the cooler 200 through the grease 300. Thus, the semiconductor device can be completed.

As described above, according to the first embodiment, the conducting layers 23, 33 of the first and second metal members 20, 30 are electrically connected to the cooler 200 though the terminal member 90. In such an approach, it is ensured that the conductive layers 23, 33 are at the same potential as the cooler 200.

For example, each of the first and second metal members 20, 30 can be connected to the cooler 200 by one terminal member 90. Alternatively, each of the first and second metal members 20, 30 can be connected to the cooler 200 by two or more terminal members 90. In such an approach, reliability of electrical connection between the cooler 200 and each of the first and second metal members 20, 30 can be improved.

In the first embodiment, the semiconductor device is configured as a "double-sided radiation semiconductor device", in which the first and second metal members 20, 30 are provided on the back and front surfaces of the semiconductor element 10, respectively, so that heat of the semiconductor element 10 can be radiated from both surfaces of the semiconductor element 10. Alternatively, the semiconductor device can be configured as a "single-sided radiation semiconductor device", in which one of the first and second metal members 20, 30 is provided on the semiconductor element 10 so that heat of the semiconductor element 10 can be radiated from only one surface of the semiconductor element 10.

Second Embodiment

Figure 3A:
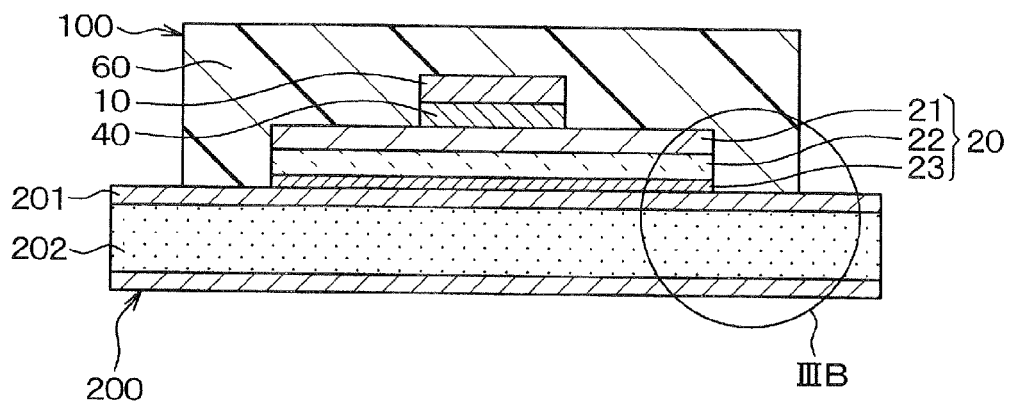
FIG. 3A is a diagram illustrating a cross-sectional view of a semiconductor device according to a second embodiment of the present invention.
Figure 3B:
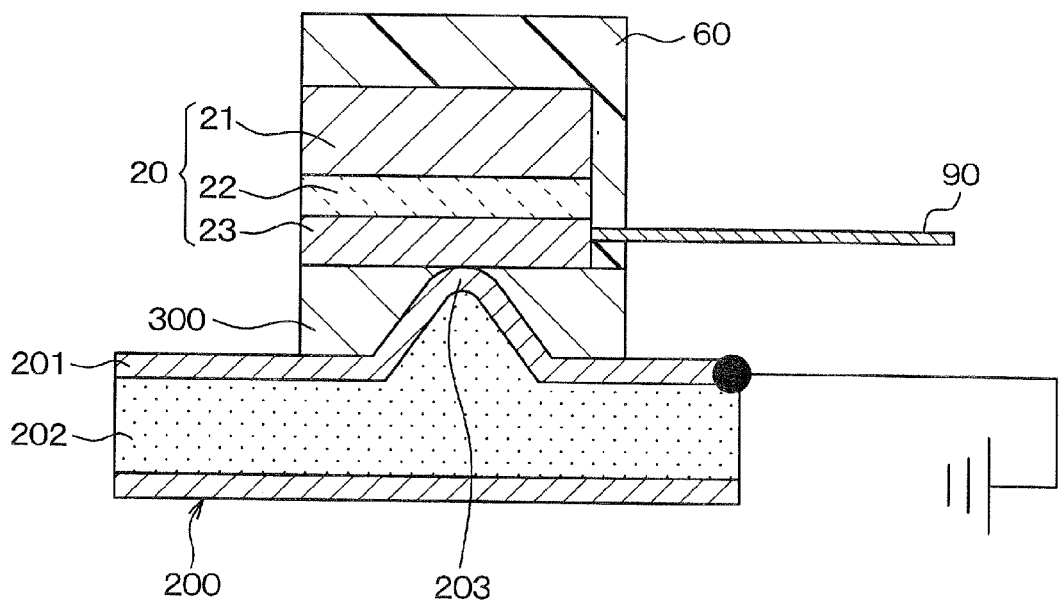
FIG. 3B is an enlarged view of a circle IIIB in FIG. 3A.

A semiconductor device according to a second embodiment of the present invention is described below with reference to FIGS. 3A and 3B. FIG. 3A is a cross-sectional view of the semiconductor device. FIG. 3B is an enlarged view of a circle IIIB in FIG. 3A. A difference of the second embodiment from the first embodiment is as follows.

In the first embodiment, the first and second metal members 20, 30 are provided on the back and front surfaces of the semiconductor element 10, respectively, so that heat of the semiconductor element 10 can be released from both surfaces of the semiconductor element 10. In contrast, in the second embodiment, as shown in FIG. 3A, although the first metal member 20 is provided on the back surface of the semiconductor element 10, there is no metal member on the front surface of the semiconductor element 10. That is, according to the second embodiment, the semiconductor device is configured as a single-sided radiation semiconductor device, and heat of the semiconductor element 10 is released from only the back surface of the semiconductor element 10.

Specifically, the second embodiment is different from the first embodiment in that the solder 40, the heat sink 50, the second metal member 30, and the cooler 200 on the front surface of the semiconductor element 10 are omitted and that the front surface of the semiconductor element 10 is covered with the molding member 60.

As shown in FIG. 3B, the conducting layer 23, serving as the radiation surface of the semiconductor package 100, is in contact with the cooler 200 through the electrically insulating grease 300. Specifically, the conducting layer 23 is in contact with the outer surface of the coolant passage 201 of the cooler 200 through the grease 300.

Like the first embodiment, the conducting layer 23 and the cooler 200 are electrically connected together so that the first metal member 20 can have the same potential structure. In the first embodiment, the same potential structure is formed by the terminal member 90. In contrast, as shown in FIG. 3B, in the second embodiment, the same potential structure is formed by a projection 203 from the cooler 200.

In an example shown in FIG. 3B, the projection 203 projects from the outer surface of the coolant passage 201 of the cooler 200 toward the conducting layer 23 that is located facing the coolant passage 201. For example, the projection 203 can be formed by a pressing (i.e., stamping) process. The projection 203 is not limited to a particular shape. For example, the projection 203 can have a conical shape or a pyramidal shape.

The projection 203 extends from the cooler 200 to the conducting layer 23 by penetrating the grease 300 and is in direct contact with the conducting layer 23. Thus, the cooler 200 is electrically connected to the conducting layer 23 at the projection 203 so that the conducting layer 23 and the cooler 200 can be at the same potential.

For example, when the semiconductor package 100 is mounted on the cooler 200 through the grease 300 during manufacturing processes, load is applied to the semiconductor package 100 so that the semiconductor package 100 can be pressed against the cooler 200. Thus, the projection 203 pushes the grease 300 aside so that a tip of the projection 203 can be in direct contact with the conducting layer 23.

In the example shown in FIG. 3B, the cooler 200 has the projection 203. Alternatively, the conducting layer 23 can have the projection 203. For example, the projection 203 can be formed in the conducting layer 23 by pressing the metal portion 21 toward the conducting layer 23. In this case, a tip of the projection 203 of the conducting layer 23 is in direct contact with the cooler 200 by penetrating the grease 300.

That is, the projection 203 is formed in one of the cooler 200 and the conducting layer 23 and extends to the other of the cooler 200 and the conducting layer 23 by penetrating the grease 300. Thus, the cooler 200 and the conducting layer 23 can be electrically connected together through the projection 203 that penetrates the grease 300. It is noted that the projection 203 and the cooler 200 or the conducting layer 23 are a single piece. In other words, the projection 203 is part of the cooler 200 or the conducting layer 23.

As described above, according to the second embodiment, the conducting layer 23 and the cooler 200 are electrically connected together through the projection 203. Thus, it is ensured that the conducting layer 23 and the cooler 200 are at the same potential.

Further, according to the second embodiment, as shown in FIG. 3B, the semiconductor device has the terminal member 90. Like the first embodiment, the first end of the terminal member 90 is located inside the molding member 60 and electrically connected to the conducting layer 23, and the second end of the terminal member 90 is exposed outside the molding member 60. Unlike the first embodiment, the second end of the terminal member 90 is not connected to the cooler 200.

The terminal member 90 can be used to check whether the conducting layer 23 and the cooler 200 are electrically connected together through the projection 203. For example, the electrical connection between the conducting layer 23 and the projection 203 can be checked by checking electrical connection between the second end of the terminal member 90 and the cooler 200 outside the molding member 60.

Figure 4:
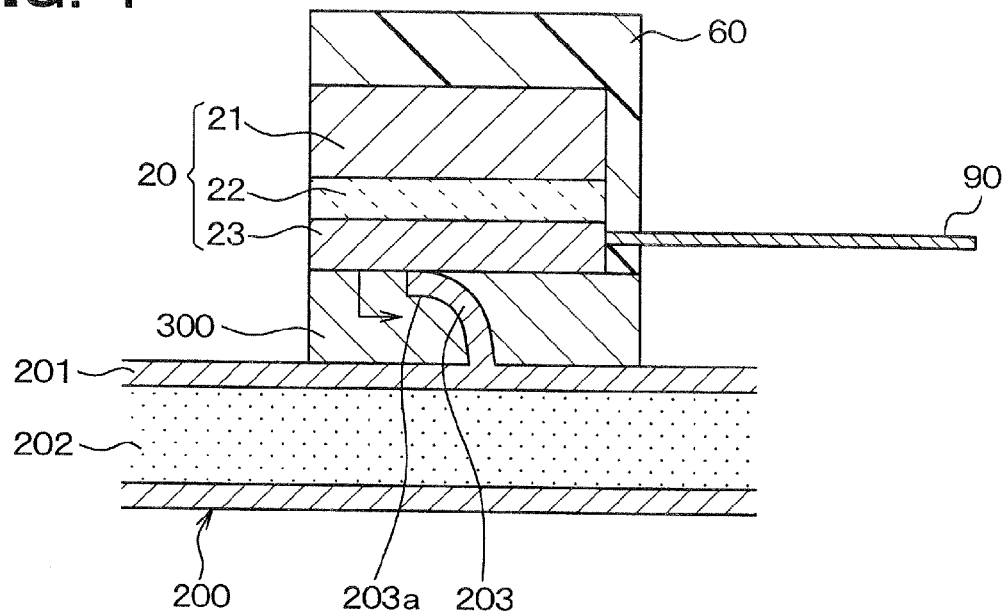
FIG. 4 is a diagram illustrating a partial cross-sectional view of a semiconductor device according to a first modification of the second embodiment.
Figure 5:
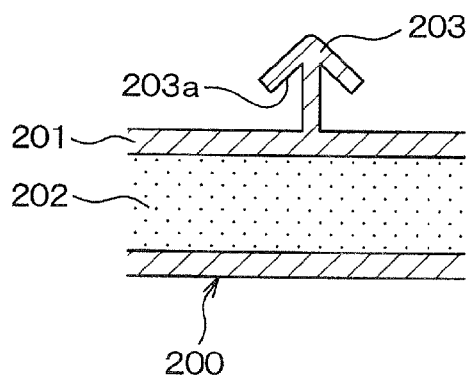
FIG. 5 is a diagram illustrating a partial cross-sectional view of a semiconductor device according to a second modification of the second embodiment.

Modifications of the second embodiment are described below with reference to FIGS. 4 and 5. FIG. 4 shows a first modification of the second embodiment, and FIG. 5 shows a second modification of the second embodiment.

According to the first modification of the second embodiment, as shown in FIG. 4, the projection 203 has a shape like a blade of a grater. Such a grater blade shape can be formed by cutting a hollow hemispherical dome shape in halves. When the projection 203 has such a grater blade shape, the projection 203 can have a recess 203a between its tip and its base.

For example, when the semiconductor package 100 is mounted on the cooler 200 through the grease 300 during manufacturing processes, the semiconductor package 100 is pressed against the cooler 200 by sliding the semiconductor package 100 over the cooler 200 so that the semiconductor package 100 can move in a reciprocating motion.

In such an approach, the grease 300 remaining at the tip of the grease 300 enters and is accommodated in the recess 203a of the projection 203, as indicated by an arrow in FIG. 4. Thus, it is ensured that the projection 203 is in direct contact with the conducting layer 23.

According to the second modification of the second embodiment, as shown in FIG. 5, the projection 203 has an umbrella shape. When the projection 203 has such an umbrella shape, the projection 203 can have the recess 203a inside.

Therefore, when the semiconductor package 100 is mounted on the cooler 200 through the grease 300 during manufacturing processes, the grease 300 enters and is accommodated in the recess 203a of the projection 203. Thus, it is ensured that the projection 203 is in direct contact with the conducting layer 23.

In the second embodiment including the modifications, the cooler 200 has one projection 203 in contact with the conducting layer 23. Alternatively, the cooler 200 can have two or more projections 203 in contact with the conducting layer 23. In such an approach, reliability of the electrical connection between the cooler 200 and the conducting layer 23 can be improved.

When the semiconductor package 100 is mounted on the cooler 200 through the grease 300 during manufacturing processes, a large current can be supplied to the conducting layer 23 and the cooler 200 so that the projection 203 can be welded to the conducting layer 23.

In such an approach, it is ensured that the projection 203 and the conducting layer 23 are electrically connected together.

Further, in the second embodiment including the modifications, the projection 203 is applied to a single-sided semiconductor device. Alternatively, the projection 203 can be applied to a double-sided semiconductor device of the first embodiment. In this case, the second end of the terminal member 90 can be disconnected from the cooler 200.

When the projection 203 is applied to a double-sided semiconductor device, the projection 203 can be provided in the cooler 200 or the conducting layers 23, 33.

Third Embodiment

Figure 6:
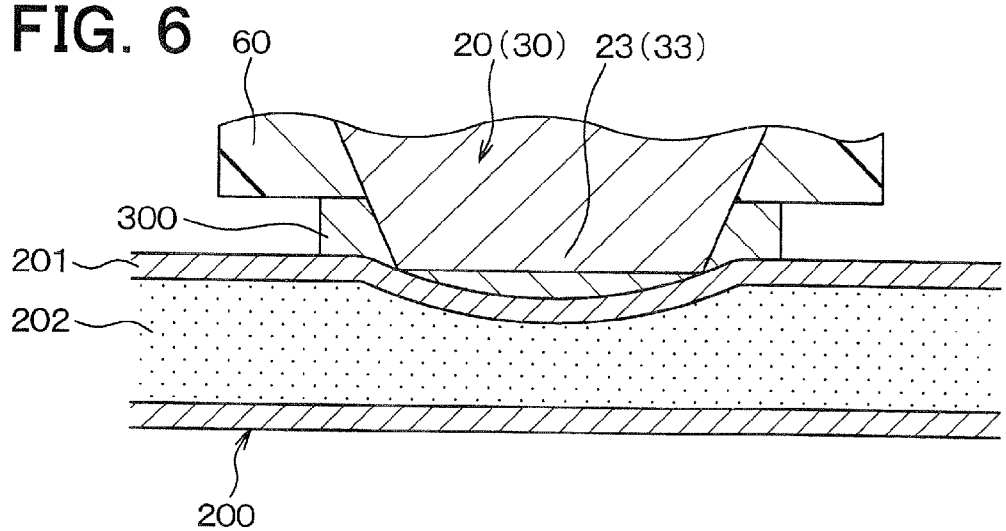
FIG. 6 is a diagram illustrating a partial cross-sectional view of a semiconductor device according to a third embodiment of the present invention.

A semiconductor device according to a third embodiment of the present invention is described below with reference to FIG. 6. FIG. 6 is a partial cross-sectional view of the semiconductor device. A difference of the third embodiment from the first embodiment is as follows.

FIG. 6 illustrates the same potential structure of only the first metal member 20. It is noted that the same potential structure of the second metal member 30 is formed in the same manner as the same potential structure of the first metal member 20, as indicated by numbers in parentheses in FIG. 6.

As shown in FIG. 6, the conducting layer 23, serving as the radiation surface of the semiconductor package 100, is in contact with the cooler 200 through the electrically insulating grease 300. In an example shown in FIG. 6, the conducting layer 23 is in contact with the outer surface of the coolant passage 201 of the cooler 200 through the grease 300.

In the first embodiment, the conducting layer 23 is flush with an outer surface of the molding member 60 located facing the cooler 200. In contrast, in the third embodiment, the conducting layer 23 projects from the outer surface of the molding member 60 toward the cooler 200. In other words, the radiation surface of the semiconductor package 100 projects from the outer surface of the molding member 60.

The projecting radiation surface of the semiconductor package 100 is pressed against the cooler 200 through the grease 300 so that the conducting layer 23 and the cooler 200 can be electrically connected together to form the same potential structure.

That is, the projecting radiation surface of the semiconductor package 100 pushes the grease 300 aside and is in direct contact with the cooler 200.

Specifically, when the projecting radiation surface of the semiconductor package 100 is pressed against the cooler 200, the outer surface of the cooler 200 is slightly recessed. In this case, an edge of the projecting radiation surface of the semiconductor package 100 is in direct contact with the recessed outer surface of the cooler 200 so that the conducting layer 23 and the cooler 200 can be electrically connected together.

As described above, according to the third embodiment, the conducting layer 23 of the first metal member 20 projects from the outer surface of the molding member 60 and is in direct contact with the cooler 200. Thus, it is ensured that the conducting layer 23 and the cooler 200 are at the same potential. As mentioned previously, the conducting layer 23 of the second metal member 30 projects from the outer surface of the molding member 60 and is in direct contact with the cooler 200.

In an example shown in FIG. 6, a tip of the projecting conducting layer 23 has a flat surface with a rectangular shape, for example, and an edge of the flat surface is in direct contact with the cooler 200. It is noted that the tip of the projecting conducting layer 23 is not limited to the flat surface.

Although not shown in the drawings, according to the third embodiment, the semiconductor device can include the terminal member 90 having the first end connected to the conducting layer 23 inside the molding member 60 and the second end exposed outside the molding member 60.

In such an approach, the electrical connection between the conducting layer 23 and the projection 203 can be checked by using the terminal member 90.

The third embodiment can be applied to both a double-sided semiconductor device and a single-sided semiconductor device.

Fourth Embodiment

Figure 7:
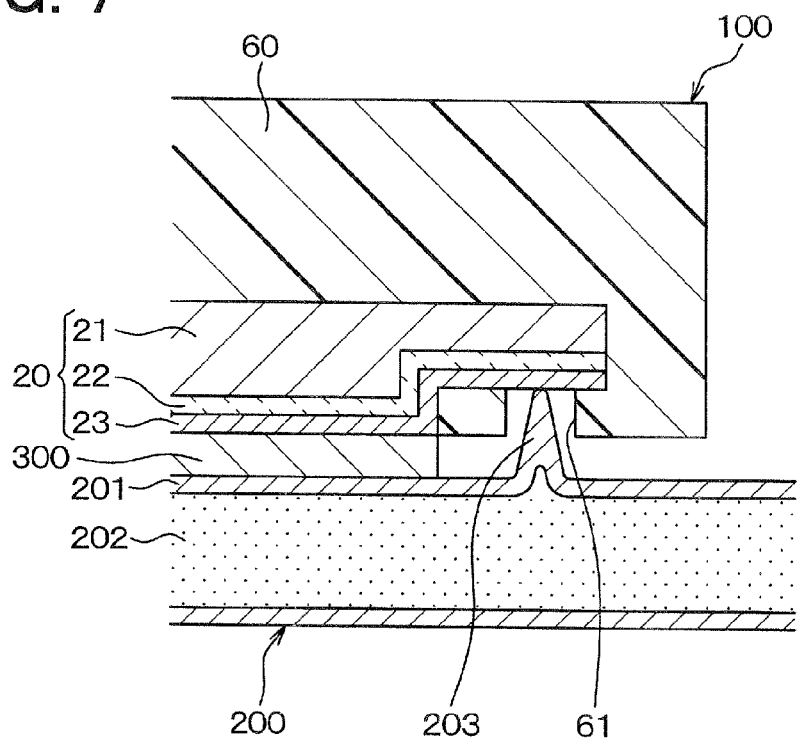
FIG. 7 is a diagram illustrating a partial cross-sectional view of a semiconductor device according to a fourth embodiment of the present invention.

A semiconductor device according to a fourth embodiment of the present invention is described below with reference to FIG. 7. FIG. 7 is a partial cross-sectional view of the semiconductor device.

Like the second embodiment, according to the fourth embodiment, the cooler 200 has the projection 203 for forming the same potential structure. A difference of the fourth embodiment from the second embodiment is that the projection 203 is located where there is no grease 300.

As shown in FIG. 7, the conducting layer 23 is in contact with the outer surface of cooler 200 through the grease 300.

According to the fourth embodiment, the conducting layer 23 is partially covered with the molding member 60. An uncovered portion of the conducting layer 23 serves as the radiation surface. A through hole 61 is formed in the molding member 60 so that the covered portion of the conducting layer 23 can be exposed in the through hole 61. The through hole 61 can be formed by forming a projection, corresponding to the through hole 61, in a mold for the molding member 60.

The projection 203 extends from the outer surface of the coolant passage 201 toward the conducting layer 23. The projection 203 is located facing the through hole 61.

The projection 203 enters the through hole 61 and is in direct contact with the conducting layer 23 in the through hole 61. Thus, the conducting layer 23 and the cooler 200 are electrically connected together and at the same potential. The projection 203 is not limited to a shape shown in FIG. 7. For example, the projection 203 can have the shapes shown in FIGS. 3B, 4, and 5. The through hole 61 is not limited to a particular shape. For example, the through hole 61 can have a circular shape or a rectangular shape.

As described above, according to the fourth embodiment, the cooler 203 has the projection 203 at a position where there is no grease 300, and the conducting layer 23 and the cooler 200 are electrically connected together through the projection 203. In such an approach, the thickness of the grease 300 between the radiation surface (i.e., uncovered portion of the conducting layer 23) and the cooler 200 can be reduced regardless of the height of the projection 203. Thus, a reduction in radiation performance can be prevented as much as possible.

For example, in the second embodiment shown in FIG. 3B, the thickness of the grease 300 depends on the height of the projection 203. Therefore, when the height of the projection 203 is large, the radiation performance may be reduced due to a large thickness of the grease 300. In contrast, in the fourth embodiment, since the thickness of the grease 300 can be reduced regardless of the height of the projection 203, the reduction in the radiation performance can be prevented as much as possible.

In this way, the conducting layer 23 and the cooler 200 are electrically connected together through the projection 203. Thus, it is ensured that the conducting layer 23 and the cooler 200 are at the same potential.

Although not shown in the drawings, according to the fourth embodiment, the semiconductor device can include the terminal member 90 having the first end connected to the conducting layer 23 inside the molding member 60 and the second end exposed outside the molding member 60. In such an approach, the electrical connection between the conducting layer 23 and the cooler 200 through the projection 203 can be checked by using the terminal member 90.

In an example shown in FIG. 7, the cooler 200 has one projection 203 in contact with the conducting layer 23 in the through hole 61. Alternatively, the cooler 200 can have two or more projections 203 in contact with the conducting layer 23 in the through hole 61. In such an approach, reliability of the electrical connection between the cooler 200 and the conducting layer 23 can be improved.

The fourth embodiment can be applied to both a double-sided semiconductor device and a single-sided semiconductor device.

Fifth Embodiment

Figure 8:
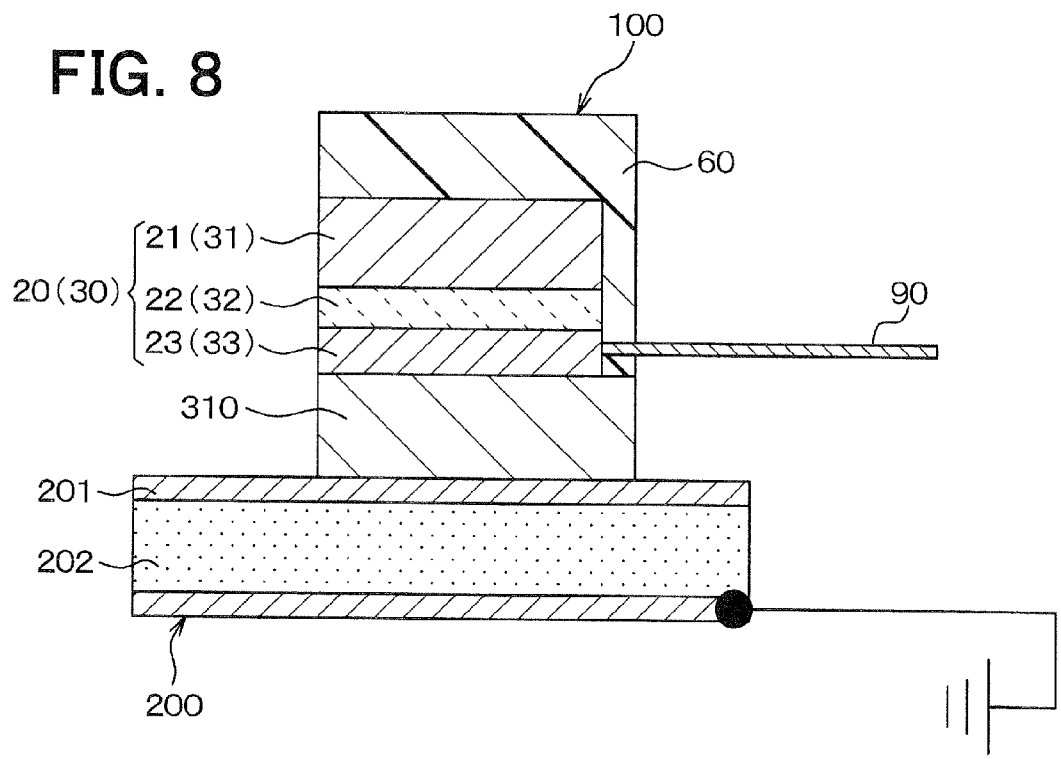
FIG. 8 is a diagram illustrating a partial cross-sectional view of a semiconductor device according to a fifth embodiment of the present invention.

A semiconductor device according to a fifth embodiment of the present invention is described below with reference to FIG. 8. FIG. 8 is a partial cross-sectional view of the semiconductor device.

The fifth embodiment is similar to the first embodiment. As can be seen by comparing FIG. 1B and FIG. 8, a difference of the fifth embodiment from the first embodiment is in that the terminal member 90 is not connected to the cooler 200 and that the electrically insulating grease 300 is replaced with an electrically conducting grease 310. The conducting layer 23 and the cooler 200 are electrically connected together through the grease 310 to form the same potential structure in which the conducting layer 23 and the cooler 200 are at the same potential.

FIG. 8 illustrates the same potential structure of only the first metal member 20. It is noted that the same potential structure of the second metal member 30 is formed in the same manner as the same potential structure of the first metal member 20, as indicated by numbers in parentheses in FIG. 8.

As shown in FIG. 8, the conducting layer 23 as the radiation surface of the semiconductor package 100 is in contact with the outer surface of the cooler 200 through the grease 310. Thus, the conducting layer 23 and the cooler 200 are electrically connected together through the grease 310. For example, the grease 310 can be resin containing conductive filler such as copper or silver.

As described above, according to the fifth embodiment, the conducting layer 23 of the metal member 20 and the cooler 200 are electrically connected together through the grease 310. Thus, it is ensured that the conducting layer 23 and the cooler 200 are at the same potential.

Further, as shown in FIG. 8, the semiconductor device includes the terminal member 90 having the first end connected to the conducting layer 23 inside the molding member 60 and the second end exposed outside the molding member 60. In such an approach, the electrical connection between the conducting layer 23 and the cooler 200 through the grease 310 can be checked by using the terminal member 90. The terminal member 90 can be omitted.

Although not shown in the drawings, the electrically conducting grease 310 can be located in the center of a contact surface between the conducting layer 23 and the cooler 200, and the electrically insulating grease 300 can be located on the periphery of the contact surface to surround the electrically conducting grease 310. In such an approach, it is possible to prevent the electrically conducting grease 310 from spreading out of the semiconductor package 100. Thus, a short-circuit between the semiconductor package 100 and another device located adjacent to the semiconductor package 100 can be prevented.

The fifth embodiment can be applied to both a double-sided semiconductor device and a single-sided semiconductor device.

Sixth Embodiment

Figure 9A:
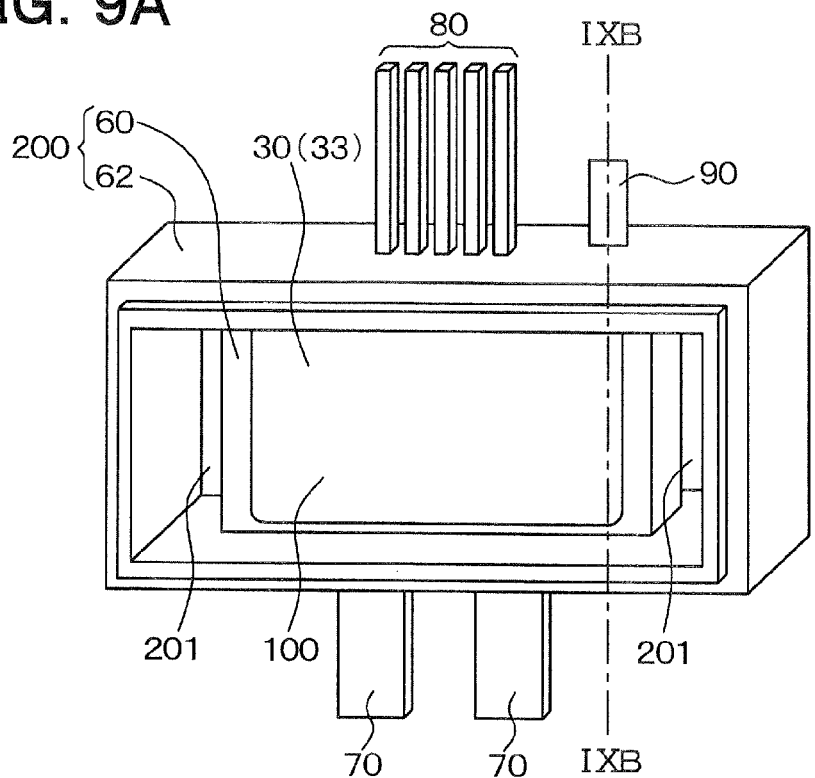
FIG. 9A is a diagram illustrating a perspective view of a semiconductor device according to a sixth embodiment of the present invention.
Figure 9B:
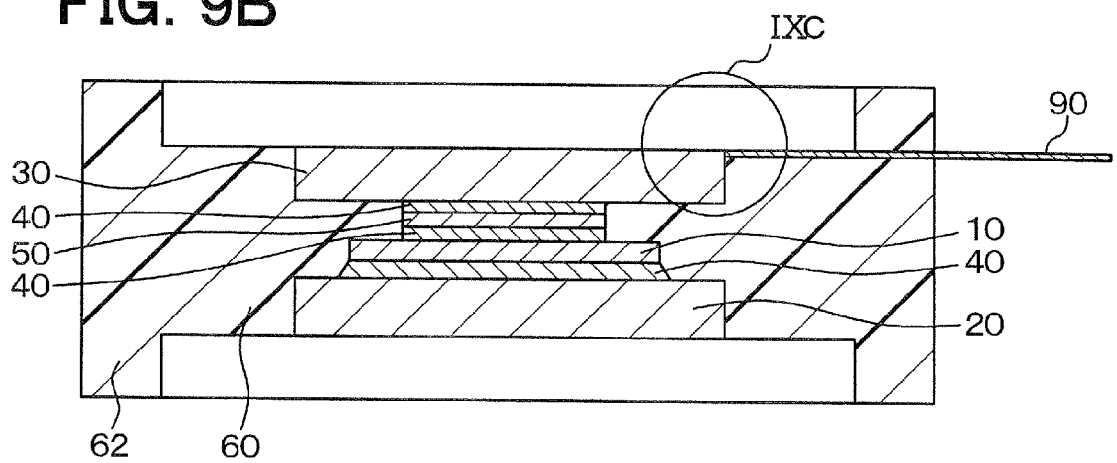
FIG. 9B is a diagram illustrating a cross-sectional view taken along the line IXB-IXB in FIG. 9A.
Figure 9C:
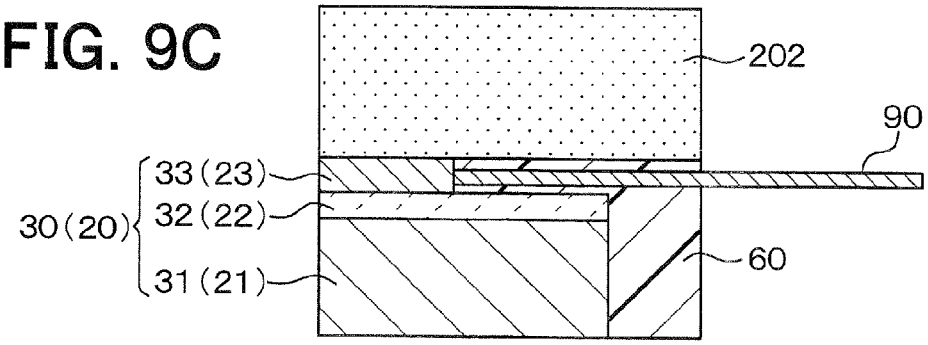
FIG. 9C is an enlarged view of a circle IXC in FIG. 9B.

A semiconductor device according to a sixth embodiment of the present invention is described below with reference to FIGS. 9A-9C. FIG. 9A is a perspective view of the semiconductor device. FIG. 9B is a cross-sectional view taken along the line IXB-IXB in FIG. 9A. FIG. 9C is an enlarged view of a circle IXC in FIG. 9B.

According to the sixth embodiment, the semiconductor device includes a wall portion 62 for defining the coolant passage 201 where the coolant 202 circulates. The wall portion 62 can be made of the same material as the molding member 60.

As shown in FIGS. 9A-9C, the molding member 60 covers the semiconductor element 10 and the metal members 20, 30 to form the semiconductor package 100. The wall portion 62 has a ring shape and located around the molding member 60 to surround the radiation surface of the semiconductor package 100. The molding member 60 and the wall portion 62 are spaced from each other to form a through hole as the coolant passage 201.

The molding member 60 and the wall portion 62 can be formed by a molding process. The molding member 60 and the wall portion 62 can be a single piece of resin. Alternatively, the molding member 60 and the wall portion 62 can be separate ingle pieces of resin. In this case, the molding member 60 and the wall portion 62 can be joined together by an adhesive process, a secondary molding process, or the like.

As shown in FIG. 9C, when the coolant 202 circulates through the coolant passage 201, the coolant 202 is in direct contact with the conducting layers 23, 33 as the radiation surfaces of the semiconductor package 100 so that the radiation surfaces can be cooled.

FIG. 9C illustrates the same potential structure of only the second metal member 30. It is noted that the same potential structure of the first metal member 20 is formed in the same manner as the same potential structure of the second metal member 30, as indicated by numbers in parentheses in FIG. 9C.

According to the sixth embodiment, the coolant 202 has an electrical conductivity. Thus, the conducting layers 23, 33 of the metal members 20, 30 are electrically connected to the cooler 200 through the coolant 202. The coolant 202 can be water. However, water is decomposed by an electric current. Therefore, it is preferable that the coolant 202 be liquid sodium, mercury, or the like.

As described above, according to the sixth embodiment, the conducting layers 23, 33 of the metal members 20, 30 are electrically connected to the cooler 200 through the coolant 202. Thus, it is ensured that the conducting layers 23, 33 can be at the same potential as the cooler 200.

Further, as shown in FIGS. 9A-9C, the semiconductor device includes the terminal member 90 having the first end connected to the conducting layers 23, 33 inside the molding member 60 and the second end exposed outside the molding member 60.

In such an approach, the electrical connection between the cooler 200 and the conducting layers 23, 33 through the coolant 202 can be checked by using the terminal member 90.

The sixth embodiment can be applied to both a double-sided semiconductor device and a single-sided semiconductor device.

Seventh Embodiment

Figure 10A:
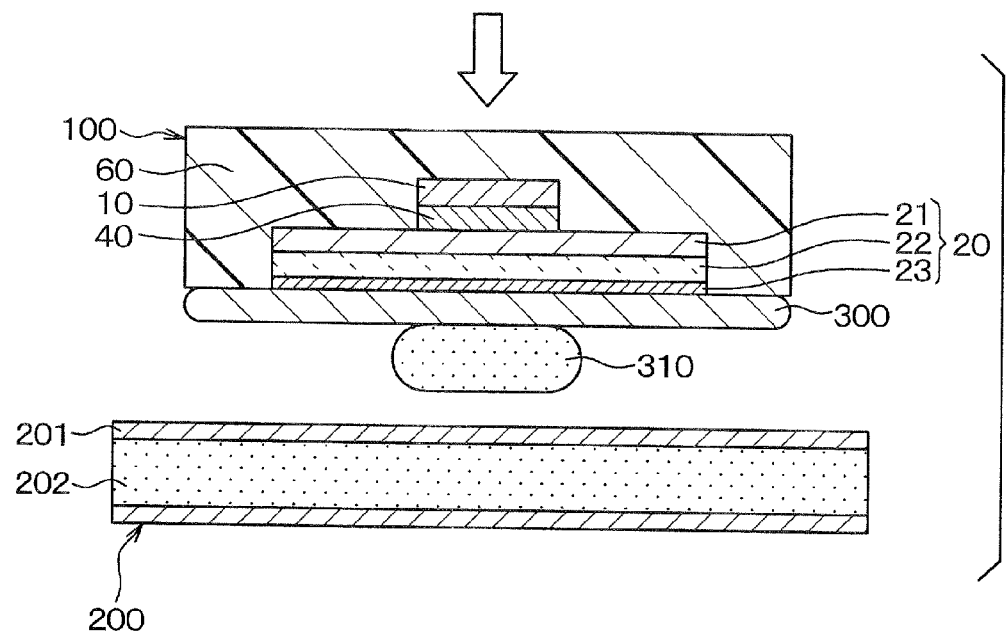
FIG. 10A is a diagram illustrating an exploded view of a semiconductor device according to a seventh embodiment of the present invention.
Figure 10B:
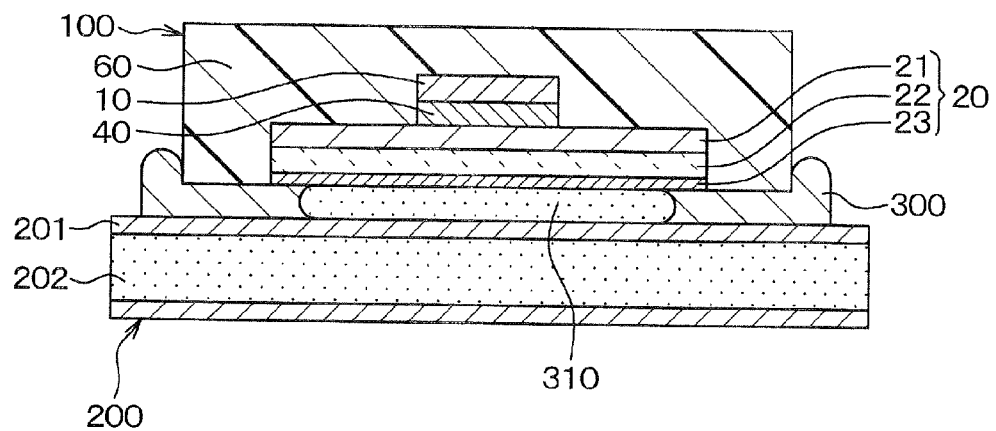
FIG. 10B is an assembled view of the semiconductor device of FIG. 10A.

A semiconductor device according to a seventh embodiment of the present invention is described below with reference to FIGS. 10A and 10B. FIG. 10A is an exploded view of the semiconductor device. FIG. 10B is an assembled view of the semiconductor device.

As shown in FIG. 10B, the electrically insulating grease 300 and the electrically conducting grease 310 are located between the conducting layer 23 (i.e., radiation surface of the semiconductor package 100) and the cooler 200 in such a manner that the grease 310 is entirely surround by the grease 300.

The conducting layer 23 is in contact with the cooler 200 through both the grease 300 and the grease 310 and electrically connected to the cooler 200 through only the grease 310.

For example, the semiconductor package 100 and the cooler 200 can be assembled into the semiconductor device as follows. Firstly, as shown in FIG. 10A, the electrically insulating grease 300 is placed on the entire surface of the conducting layer 23. Then, the electrically conducting grease 310 is placed on the grease 300 in the center of the conducting layer 23. Then, as indicated by an arrow in FIG. 10A, the semiconductor package 100 is placed on the cooler 200 through the greases 300, 310 and pressed against the cooler 200. Thus, as shown in FIG. 10B, the semiconductor package 100 and the cooler 200 are assembled into the semiconductor device.

As described above, according to the seventh embodiment, the greases 300, 310 are located between the conducting layer 23 and the cooler 200 in such a manner that the electrically conducting grease 310 is entirely surround by the electrically insulating grease 300. In such an approach, it is possible to prevent the electrically conducting grease 310 from spreading out of the semiconductor package 100. Thus, a short-circuit between the semiconductor package 100 and another device located adjacent to the semiconductor package 100 can be prevented. As shown in FIG. 10B, there is possibility that the grease 300 from spreading out of the semiconductor package 100. However, the spread of the grease 300 does not cause a problem such as a short-circuit, because the grease 300 has an electrically insulating property.

First Modification of the Seventh Embodiment

Figure 11A:
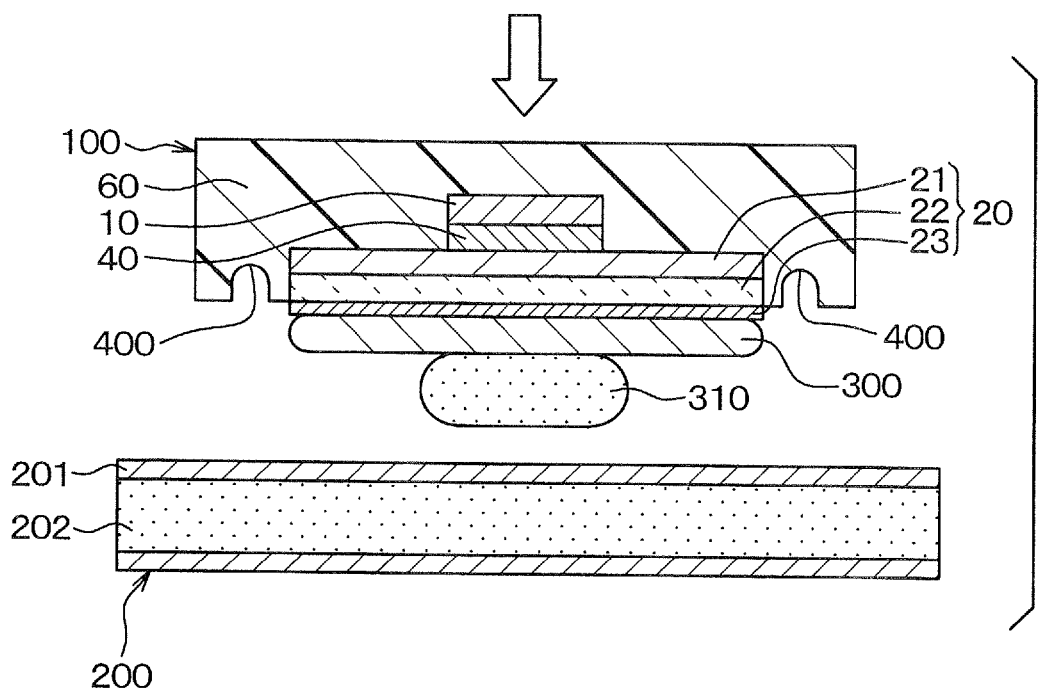
FIG. 11A is a diagram illustrating an exploded view of a semiconductor device according to a first modification of the seventh embodiment.
Figure 11B:
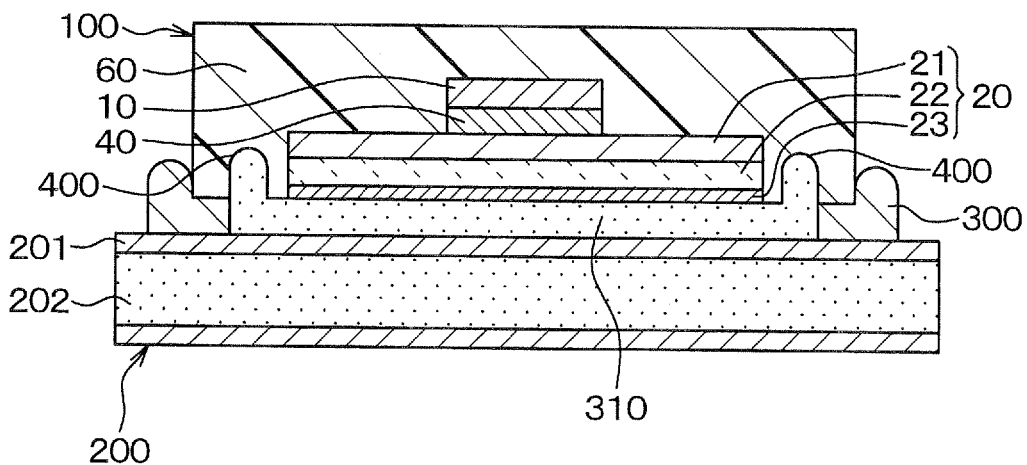
FIG. 11B is an assembled view of the semiconductor device of FIG. 11A.

FIGS. 11A and 11B illustrate a semiconductor device according to a first modification of the seventh embodiment.

FIG. 11A is an exploded view of the semiconductor device. FIG. 11B is an assembled view of the semiconductor device.

According to the first modification, the greases 300, 310 are located between the conducting layer 23 and the cooler 200 in such a manner that the electrically conducting grease 310 is entirely surround by the electrically insulating grease 300. The conducting layer 23 is in contact with the cooler 200 through both the grease 300 and the grease 310 and electrically connected to the cooler 200 through only the grease 310.

Since the electrically conducting grease 310 is entirely surround by the electrically insulating grease 300, it is possible to prevent the electrically conducting grease 310 from spreading out of the semiconductor package 100. Thus, a short-circuit between the semiconductor package 100 and another device located adjacent to the semiconductor package 100 can be prevented.

Further, according to the first modification, the semiconductor package 100 has a groove 400 around the grease 310 to prevent the grease 310 from spreading over the groove 400. Specifically, the groove 400 has a ring shape, surrounding the grease 310, and is formed in the molding member 60 by a molding process or the like.

When the semiconductor package 100 and the cooler 200 are assembled into the semiconductor device by pressing the semiconductor package 100 against the cooler 200 through the greases 300, 310, the electrically conducting grease 310 spreads and enters the groove 400. Thus, the groove 400 prevents the electrically conducting grease 310 from spreading out of the semiconductor package 100.

Thus, the conducting layer 23 and the cooler 200 can be electrically connected together through the electrically conducting grease 310 while preventing the grease 310 from causing a problem such as a short-circuit between the semiconductor package 100 and another device located adjacent to the semiconductor package 100.

Preferably, the groove 400 can have a continuous ring shape surrounding the entire periphery of the grease 310. Alternatively, the groove 400 can have a discontinuous ring shape having multiple groove portions arranged in a ring shape. In this case, for example, there is no groove portion at a position where a distance between an edge of the grease 310 and an edge of the semiconductor package 100 is large enough to prevent the grease 310 from spreading out of the semiconductor package 100.

Second Modification of the Seventh Embodiment

Figure 12A:
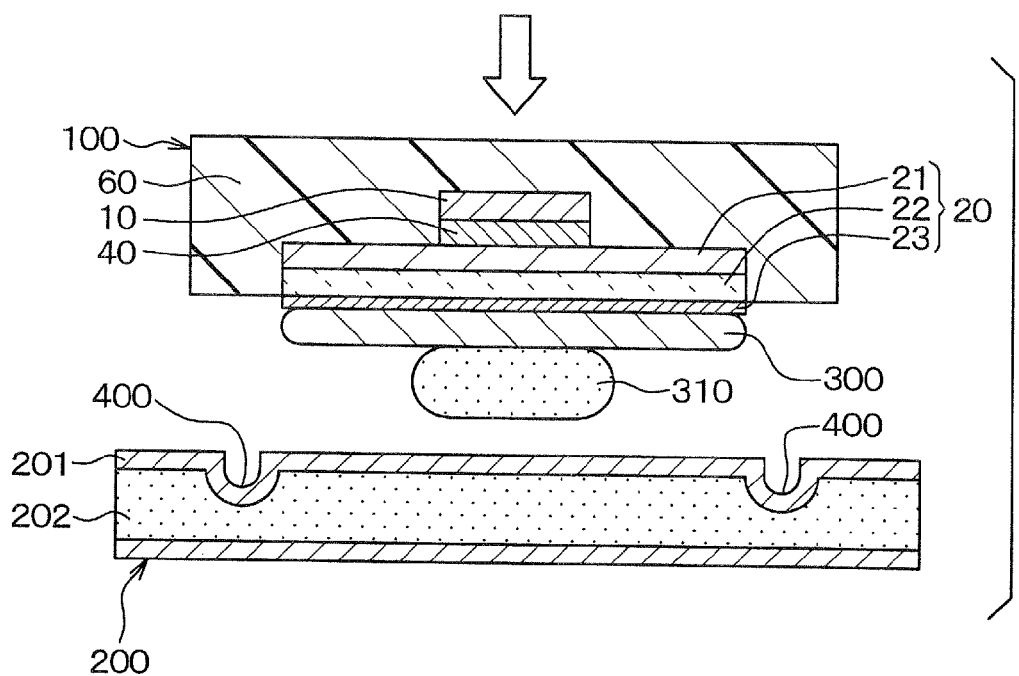
FIG. 12A is a diagram illustrating an exploded view of a semiconductor device according to a second modification of the seventh embodiment.
Figure 12B:
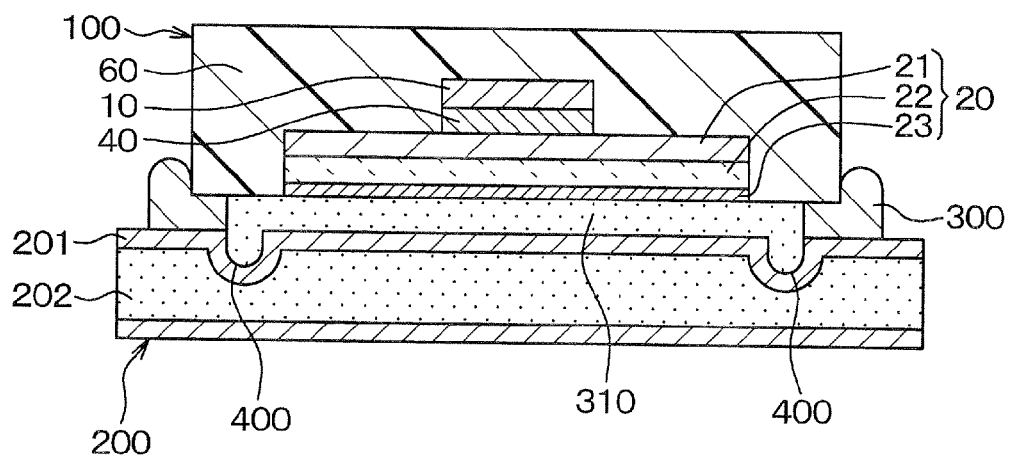
FIG. 12B is an assembled view of the semiconductor device of FIG. 12A.

FIGS. 12A and 12B illustrate a semiconductor device according to a second modification of the seventh embodiment. FIG. 12A is an exploded view of the semiconductor device. FIG. 12B is an assembled view of the semiconductor device. According to the second modification, the cooler 200 has the groove 400 around the grease 310 to prevent the grease 310 from spreading over the groove 400.

Specifically, the groove 400 has a ring shape, surrounding the grease 310, and is formed in the cooler 200 by a pressing (i.e., stamping) process or the like. When the semiconductor package 100 and the cooler 200 are assembled into the semiconductor device by pressing the semiconductor package 100 against the cooler 200 through the greases 300, 310, the electrically conducting grease 310 spreads and enters the groove 400. Thus, the groove 400 prevents the electrically conducting grease 310 from spreading out of the semiconductor package 100.

Third Modification of the Seventh Embodiment

Figure 13A:
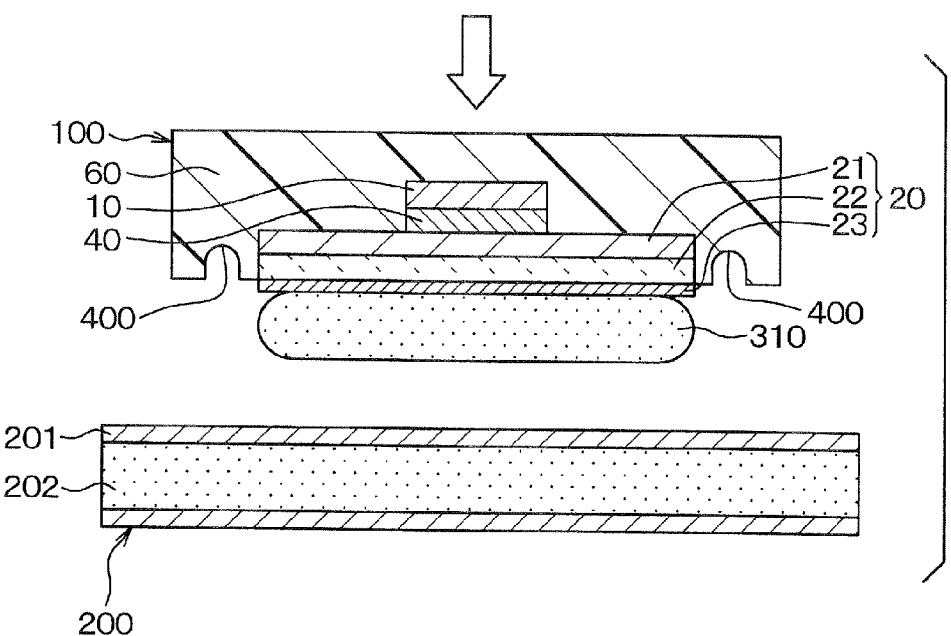
FIG. 13A is a diagram illustrating an exploded view of a semiconductor device according to a third modification of the seventh embodiment.
Figure 13B:
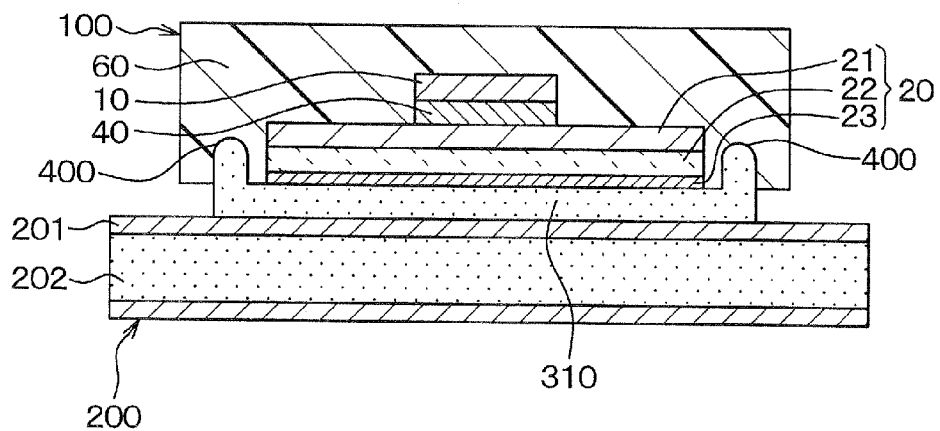
FIG. 13B is an assembled view of the semiconductor device of FIG. 13A.

FIGS. 13A and 13B illustrate a semiconductor device according to a third modification of the seventh embodiment.

FIG. 13A is an exploded view of the semiconductor device. FIG. 13B is an assembled view of the semiconductor device. According to the third modification, the electrically insulating grease 300 is not used. That is, the conducting layer 23 is in contact with and electrically connected to the cooler 200 through only the electrically conducting grease 310.

Further, according to the third modification, the semiconductor package 100 has the groove 400 around the grease 310 to prevent the grease 310 from spreading over the groove 400. Thus, the groove 400 prevents the electrically conducting grease 310 from spreading out of the semiconductor package 100. In summary, the third modification of the seventh embodiment corresponds to a combination of the fifth embodiment and the first modification of the seventh embodiment.

Fourth Modification of the Seventh Embodiment

Figure 14A:
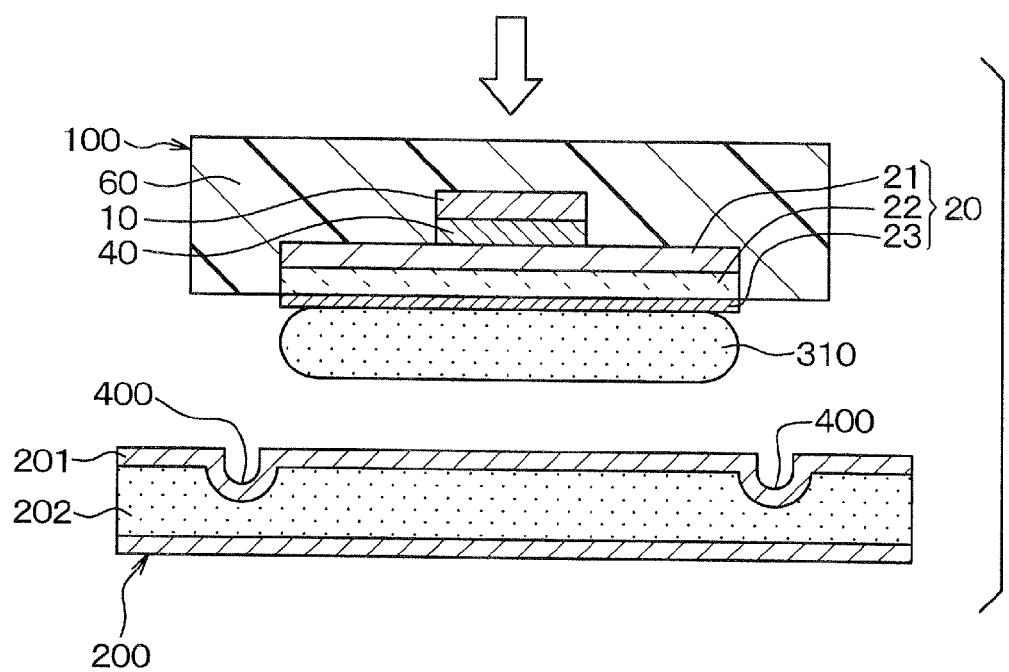
FIG. 14A is a diagram illustrating an exploded view of a semiconductor device according to a fourth modification of the seventh embodiment.
Figure 14B:
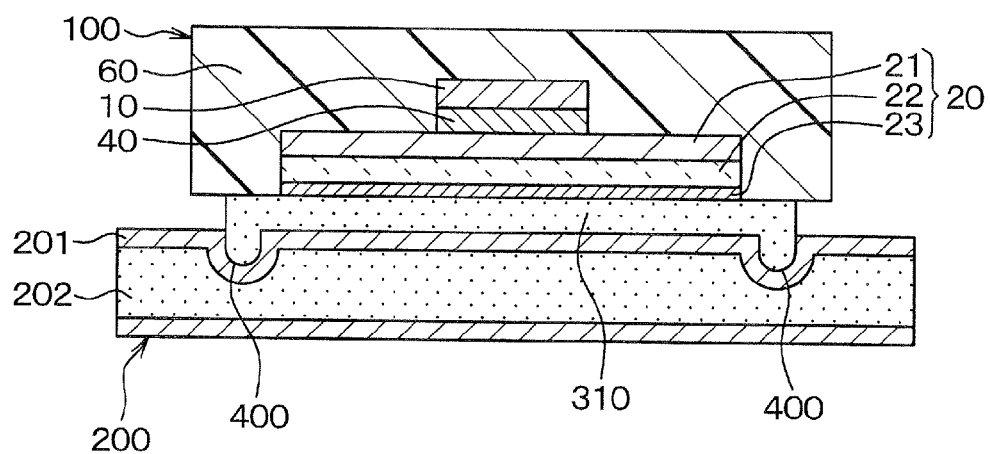
FIG. 14B is an assembled view of the semiconductor device of FIG. 14A.
Figure 15:
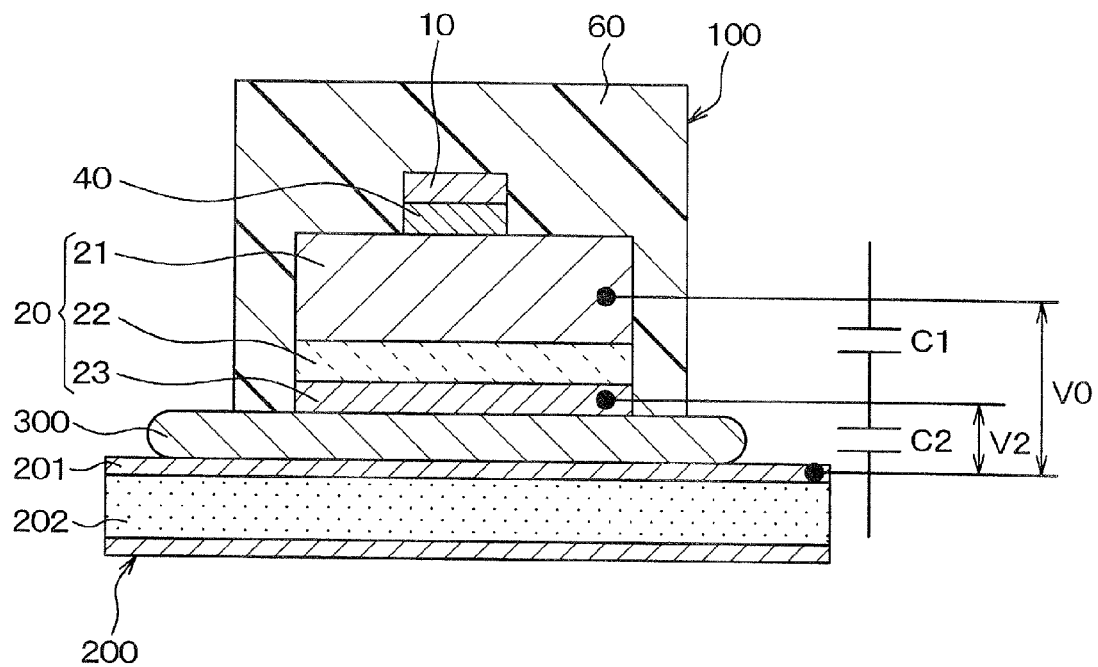
FIG. 15 is a diagram illustrating a cross-sectional view of a conventional semiconductor device.
Figure 16:
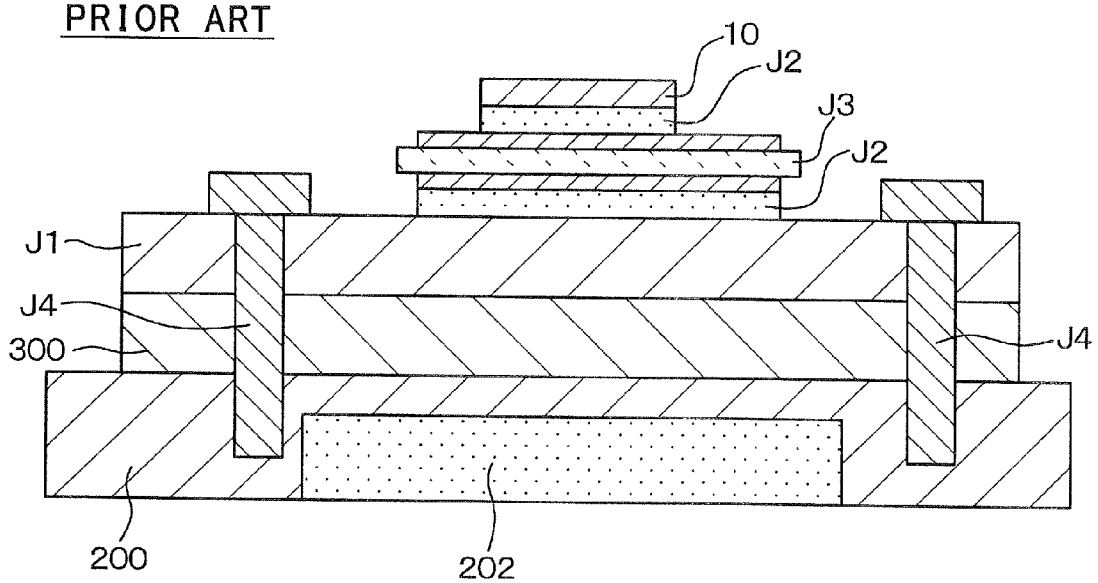
FIG. 16 is a diagram illustrating a cross-sectional view of another conventional semiconductor device.

FIGS. 14A and 14B illustrate a semiconductor device according to a fourth modification of the seventh embodiment. FIG. 14A is an exploded view of the semiconductor device. FIG. 14B is an assembled view of the semiconductor device. According to the fourth modification, the electrically insulating grease 300 is not used. That is, the conducting layer 23 is in contact with and electrically connected to the cooler 200 through only the electrically conducting grease 310.

Further, according to the fourth modification, the cooler 200 has the groove 400 around the grease 310 to prevent the grease 310 from spreading over the groove 400. Thus, the groove 400 prevents the electrically conducting grease 310 from spreading out of the semiconductor package 100. In summary, the fourth modification of the seventh embodiment corresponds to a combination of the fifth embodiment and the second modification of the seventh embodiment.

The groove 400 can be formed in both the semiconductor package 100 and the cooler 200.

The groove 400 can be formed in any of the semiconductor devices of the preceding embodiments.

The seventh embodiment can be applied to both a double-sided semiconductor device and a single-sided semiconductor device.

(Modifications)

The embodiments described above can be modified in various ways, for example, as follows.

The conducting layers 23, 33 can be made of the same material as a portion of the cooler 200 in contact with the conducting layers 23, 33. In such an approach, electric corrosion between the cooler 200 and the conducting layers 23, 33 can be reduced or prevented. For example, the conducting layers 23, 33 and the cooler 200 can be made of aluminum or copper.

In the first embodiment, the control terminal 80 and the terminal member 90 are exposed to different side surfaces of the molding member 60. Alternatively, as shown in FIG. 9A, the control terminal 80 and the terminal member 90 can be exposed to the same side surface of the molding member 60.

In such an approach, the control terminal 80 and the terminal member 90 can be connected to external circuitry, such as a control circuit, at the same time. In this case, the terminal member 90 and the cooler 200 can be electrically connected together by connecting a wire of the external circuitry to the components, such as a pump, of the cooler 200.

In the embodiments, the greases 300, 310 are used as a viscous member for filling the clearance between the radiation surface of the semiconductor package 100 and the cooler 200. Alternatively, other materials, such as electrically insulating or conducting adhesive or paste can be used as the viscous member.

Such changes and modifications are to be understood as being within the scope of the present invention as defined by the appended claims.

What is claimed is:

1. A semiconductor device comprising:
a semiconductor package including a semiconductor element, a metal member, and a molding member for encapsulating the semiconductor element and the metal member therein, the metal member having a metal portion thermally connected to the semiconductor element, an electrically insulating layer on the metal portion, and an electrically conducting layer on the insulating layer, the conducting layer being at least partially exposed outside the molding member and serving as a radiation surface for radiating heat of the semiconductor element;
a cooler having a coolant passage through which a coolant circulates, the conducting layer and the cooler being electrically connected together, and the cooler being configured to cool the conducting layer and absorb the heat from the radiating surface of the semiconductor element by circulating the coolant within the cooler;
a viscous member having a viscosity and both heat conducting and electrical insulating properties filling a clearance between the radiation surface of the semiconductor package and the cooler, and the viscous member contacting both the radiation surface and the cooler and conducting heat exchange between the radiation surface and the cooler; and
a terminal member having a first end located inside the molding member and electrically connected to the conducting layer and a second end located outside the molding member and electrically connected to the cooler, the conducting layer and the cooler being electrically connected together through the terminal member.

2. The semiconductor device according to claim 1, wherein the terminal member extends from a surface of the conducting layer that is different from the radiation surface.

3. The semiconductor device according to claim 2, wherein
the conducting layer has a front surface serving as the radiation surface, a back surface opposite to the front surface, and a side surface between the front and back surfaces, and
the terminal member extends from the side surface of the conducting layer.

4. The semiconductor device according to claim 1, wherein
the conducting layer has a front surface serving as the radiation surface, a back surface opposite to the front surface, and a side surface between the front and back surfaces, and
the terminal member extends from the side surface of the conducting layer.

* * * * *